(12) United States Patent
Gruenhagen et al.

(10) Patent No.: US 8,072,044 B2
(45) Date of Patent: Dec. 6, 2011

(54) SEMICONDUCTOR DIE CONTAINING LATERAL EDGE SHAPES AND TEXTURES

(75) Inventors: Michael D. Gruenhagen, Salt Lake City, UT (US); Rohit Dikshit, Herriman, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 103 days.

(21) Appl. No.: 12/561,988

(22) Filed: Sep. 17, 2009

(65) Prior Publication Data
US 2011/0062564 A1    Mar. 17, 2011

(51) Int. Cl.
*H01L 29/06* (2006.01)

(52) U.S. Cl. .. 257/618; 257/620; 257/623; 257/E33.006

(58) Field of Classification Search ............... 257/730, 257/773, 777, 778, 61, 620, 623, E33.006
See application file for complete search history.

(56) References Cited

U.S. PATENT DOCUMENTS

| | | | |
|---|---|---|---|
| 4,142,893 A | | 3/1979 | Adlerstein et al. |
| 4,670,770 A | * | 6/1987 | Tai ................................ 257/777 |
| 4,729,971 A | | 3/1988 | Coleman |
| 5,119,171 A | | 6/1992 | Lesk et al. |
| 5,201,987 A | | 4/1993 | Hawkins et al. |
| 5,313,092 A | | 5/1994 | Tsuruta et al. |
| 5,597,767 A | | 1/1997 | Mignardi et al. |
| 5,851,928 A | | 12/1998 | Cripe et al. |
| 5,904,546 A | | 5/1999 | Wood et al. |
| 5,952,725 A | * | 9/1999 | Ball ............................ 257/777 |
| 5,998,875 A | * | 12/1999 | Bodo et al. .................. 257/778 |
| 6,271,102 B1 | | 8/2001 | Brouillette et al. |
| 6,498,074 B2 | | 12/2002 | Siniaguine et al. |
| 6,573,156 B1 | | 6/2003 | Wang et al. |
| 6,642,127 B2 | | 11/2003 | Kumar et al. |
| 6,664,129 B2 | | 12/2003 | Siniaguine |
| 6,759,745 B2 | * | 7/2004 | Masumoto et al. ........... 257/730 |
| 6,777,267 B2 | | 8/2004 | Ruby et al. |
| 6,818,998 B2 | * | 11/2004 | Kwon et al. ................. 257/777 |
| 6,841,414 B1 | | 1/2005 | Hu et al. |
| 6,849,523 B2 | | 2/2005 | Chao et al. |

(Continued)

OTHER PUBLICATIONS

Phing-Hei Chen, The Characteristic Behavior of TMAH Water Solution for Anisotropic Etching on Both Silicon Substrate and SiO2 Layer, Sensors and Actuators, 2001, 132-137, A 93.

(Continued)

*Primary Examiner* — Jasmine Clark
(74) *Attorney, Agent, or Firm* — Kirton & McConkie; Kenneth E. Horton

(57) ABSTRACT

Methods for singulating a semiconductor wafer into a plurality of individual dies that contain lateral edges or sidewalls and the semiconductor dies formed from these methods are described. The dies are formed from methods that use a front to back photolithography alignment process to form a photoresist mask and an anisoptropic wet etch in an HNA and/or a TMAH solution on the backside of the wafer through the photoresist mask to form sloped sidewalls and/or textures. The conditions of the TMAH etching process can be controlled to form any desired combination of rough or smooth sidewalls. Thus, the dies formed have a Si front side with an area larger than the Si backside area and sidewalls or lateral edges that are not perpendicular to the front or back surface of the die. Other embodiments are also described.

23 Claims, 11 Drawing Sheets

U.S. PATENT DOCUMENTS

| | | |
|---|---|---|
| 7,084,488 B2 | 8/2006 | Thornton et al. |
| 7,335,576 B2 | 2/2008 | David et al. |
| 7,482,251 B1 | 1/2009 | Paulsen et al. |
| 7,514,291 B2 | 4/2009 | Akram |
| 7,521,798 B2 * | 4/2009 | Adkisson et al. ............. 257/737 |
| 2004/0232524 A1 | 11/2004 | Howard et al. |
| 2006/0068567 A1 | 3/2006 | Beyne et al. |
| 2006/0292827 A1 | 12/2006 | Condie et al. |

OTHER PUBLICATIONS

U.S. Appl. No. 12/103,878, filed Apr. 16, 2008, Hendricks et al.

* cited by examiner

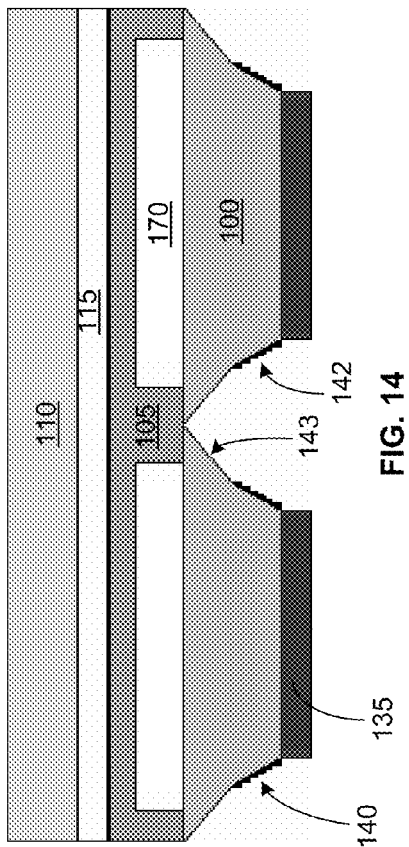
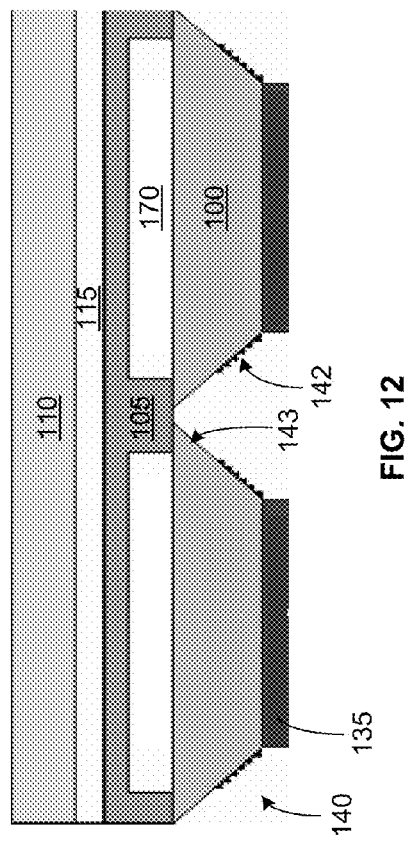
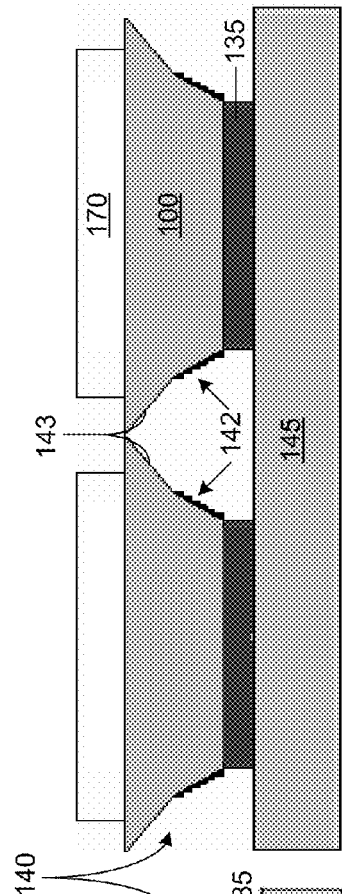
FIG. 12
FIG. 13
FIG. 14
FIG. 15

SEMICONDUCTOR DIE CONTAINING LATERAL EDGE SHAPES AND TEXTURES

FIELD

This application relates generally to semiconductor wafer processing. More specifically, this application describes methods for singulating a semiconductor wafer into a plurality of individual dies that contain lateral edges or sidewalls and the semiconductor dies formed from these methods.

BACKGROUND

As part of semiconductor device processing, a number of integrated circuits ("IC" or "ICs") are formed on a wafer, or substrate, made from a semiconductor material, such as silicon. Generally, ICs are formed with layers of materials that have semiconductive, conductive, and/or insulative properties. These materials are deposited, doped, etched, or otherwise used to form ICs in individual regions on the wafer that are called die or dies.

After the formation of ICs on the wafer, the wafer can be singulated so as to separate the individual dies from each other. The separated dies can then be used with larger circuits in either a packaged or an unpackaged form. The die singulation process can be accomplished in a variety of ways, including through a scribing, a sawing, or a dicing process.

In scribing, a diamond-tipped scribe is typically used to form shallow scratches in the wafer along pre-formed scribed lines that extend along the spaces (or streets) between the dies and across a surface of the wafer. After scribing, pressure can be applied to the wafer so as to separate or break the dies along the scribed lines. In sawing, after a wafer is thinned, by grinding or chemical etch, a high-speed diamond-tipped saw or laser is used to cut the wafer along the streets from the device side of the wafer. In a Dicing Before Grind (DBG) process, grooves are typically formed along the streets from the a front surface of the wafer (or the side of the wafer on which the ICs are located) and next the back surface of the wafer is removed (e.g., by grinding) until either the grooves are exposed so the wafer can be separated by the application of pressure at die attach.

SUMMARY

This application relates to methods for singulating a semiconductor wafer into a plurality of individual dies that contain lateral edges or sidewalls and the semiconductor dies formed from these methods. The dies are formed from methods that use a front to back photolithography alignment process to form a photo-resist mask and an anisoptropic wet etch in an HNA (HF, Nitric, Acetic) and/or a TMAH (Tetra Methyl Ammonium Hydroxide) solution on the backside of the wafer through the photoresist mask to form sloped sidewalls and/or die edge Si texturing. The conditions of the TMAH etching process can be controlled to form any desired combination of rough or smooth sidewalls. Thus, the dies formed have a front side with an area larger than the backside and sidewalls or lateral edges that are not perpendicular to the front or back surface of the die.

BRIEF DESCRIPTION OF THE DRAWINGS

The following description can be better understood in light of the Figures, in which:

FIG. 12 shows some embodiments of methods for anisotropically etching the backside of the substrate to form a sidewall with both a rough and a smooth surface;

FIG. 13 shows some embodiments of methods for attaching a dicing tape to the pattern backmetal layer;

FIG. 14 shows some embodiments of methods for anisotropically etching the backside of the substrate to form a sidewall with both a rough and a smooth surface and a changed angle;

FIG. 15 shows some embodiments of methods for attaching a dicing tape to the pattern backmetal layer;

FIG. 24 shows some embodiments of methods for disconnecting a substrate wafer from a carrier.

Figure 1:
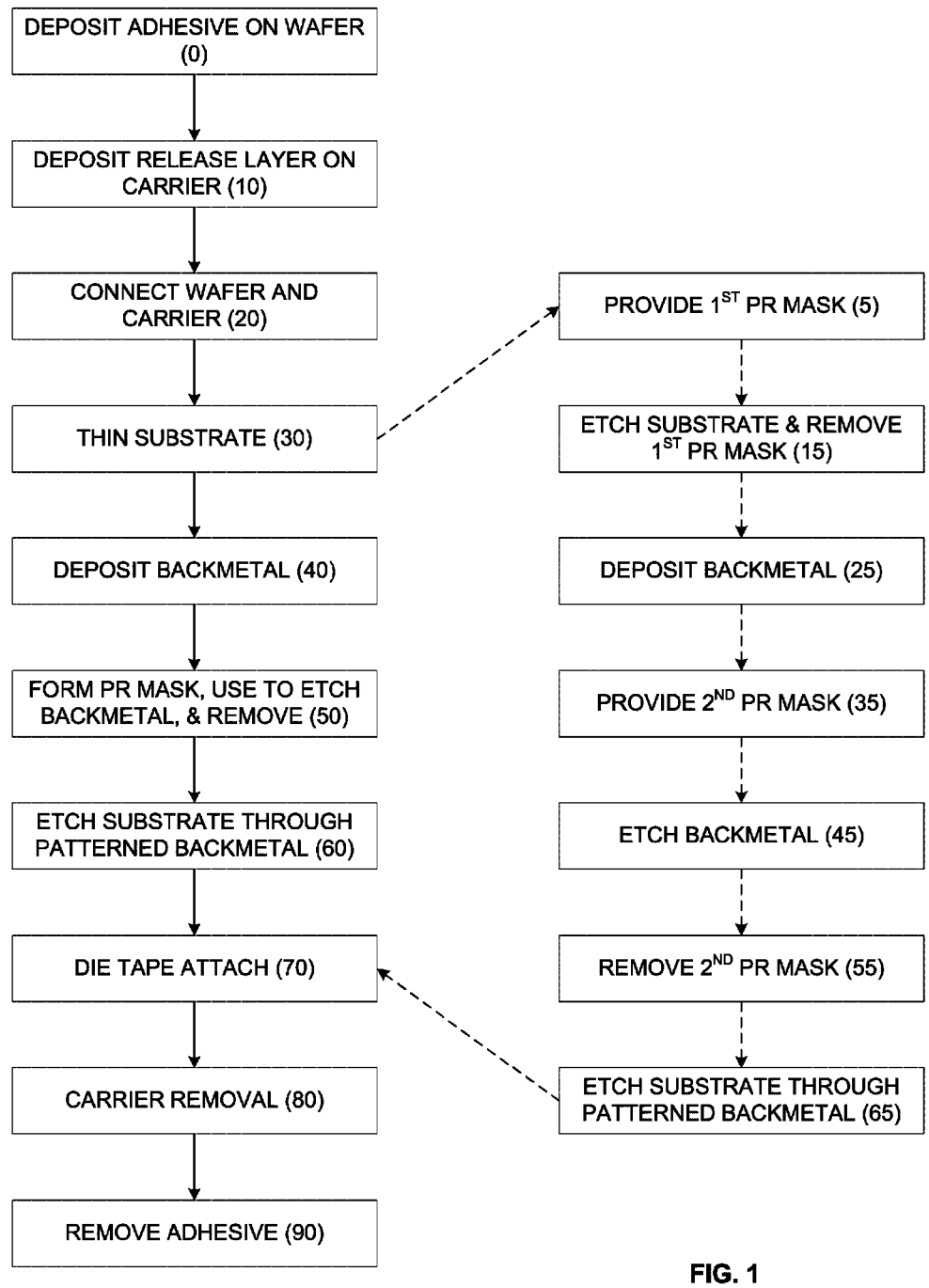
FIG. 1 shows some embodiments of methods for singulating a wafer into a plurality of dies.

The Figures illustrate specific aspects of the methods for singulating a semiconductor wafer and the dies formed by such methods. Together with the following description, the Figures demonstrate and explain the principles of the singulation methods and dies produced through such methods. In the drawings, the thickness of layers and regions are exaggerated for clarity. It will also be understood that when a layer, component, or substrate is referred to as being "on" another layer, component, or substrate, it can be directly on the other

DETAILED DESCRIPTION

The following description supplies specific details in order to provide a thorough understanding. Nevertheless, the skilled artisan would understand that the semiconductor devices and associated methods of using the devices can be implemented and used without employing these specific details. Indeed, the devices and associated methods can be placed into practice by modifying the illustrated devices and associated methods and can be used in conjunction with any other apparatus and techniques conventionally used in the industry. For example, while the detailed description focuses on using methods with metal-oxide-semiconductor field-effect transistors ("MOSFET") that comprise a back side drain, the described methods can be used with any semiconductor die containing any integrated circuit used in semiconductor devices.

Some embodiments for the methods for singulating a semiconductor wafer into a plurality of individual dies are illustrated in the Figures. The methods begin by providing substrate wafer 100. The wafer can have any characteristic suitable for use with the methods described herein. For example, the wafer may comprise any semiconductor material that is suitable for use as a substrate in the production of individual dies. Some non-limiting examples of suitable semi-conductive materials can comprise silicon, gallium arsenide, germanium, and so forth.

Figure 3:
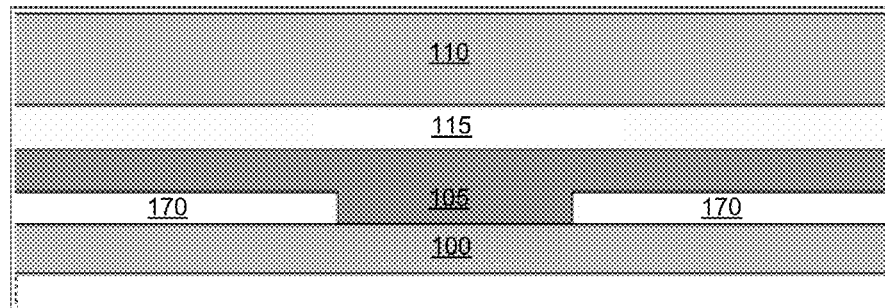
FIG. 3 shows some embodiments of methods for thinning the substrate carrier bonded wafer.

The wafer (or substrate) 100 can contain any number of integrated circuit (IC) devices. The IC device may be any known integrated circuit (including any discrete device) in the art. Some non-limiting examples of these devices may include analog, logic or digital IC, linear regulators, audio power amplifiers, LDO, driver IC, diodes, and/or transistors, including zener diodes, schottky diodes, small signal diodes, bipolar junction transistors ("BJT"), metal-oxide-semiconductor field-effect transistors ("MOSFET"), insulated-gate-bipolar transistors ("IGBT"), and insulated-gate field-effect transistors ("IGFET"). In some embodiments, the IC device comprises a MOSFET 170 as shown in FIG. 3 with a drain on the backside (or bottom surface) of the substrate (not shown) or the drain is routed back up to the device front side (as found in a DMOS WLCSP package). In the embodiments of an analog, memory or microprocessor device, the die backside serves as the heat sink for the die.

Figure 2:
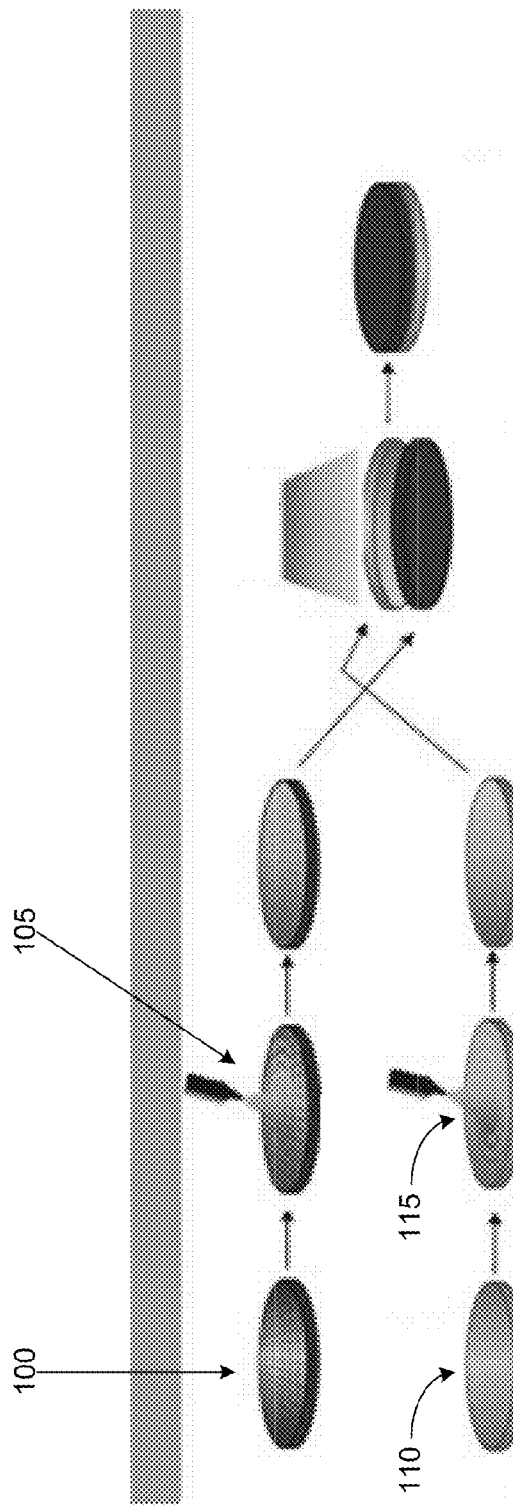
FIG. 2 shows some embodiments of methods for connecting a substrate wafer to a carrier using 3M™ carrier processing.
Figure 2A:
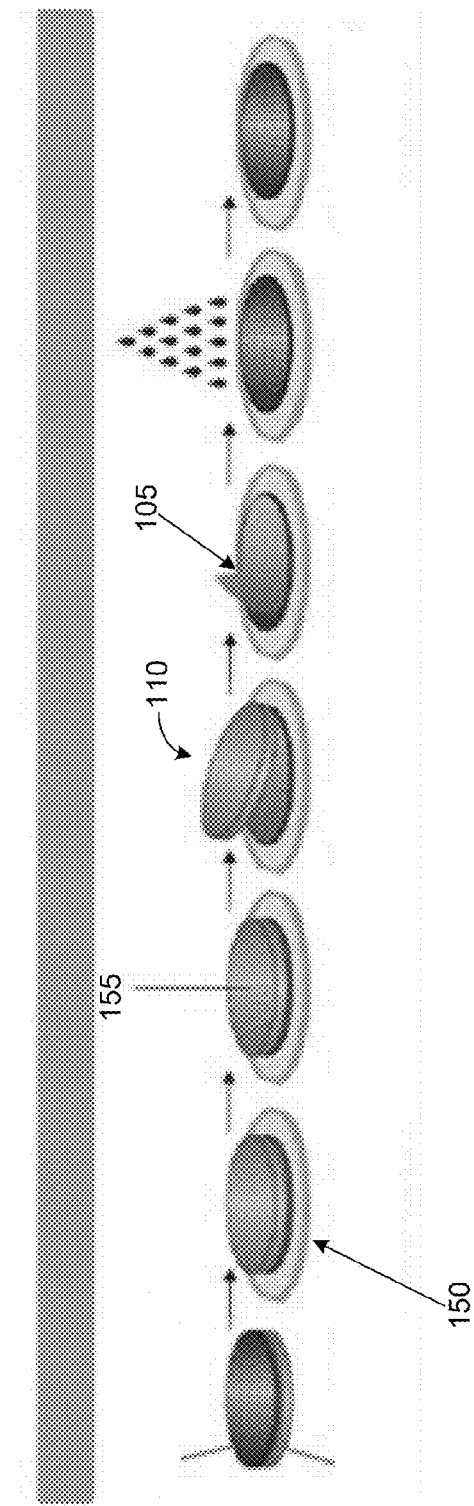

As shown in box 0 of FIG. 1, the method continues when the upper or front surface of the substrate 100 can be provided with an adhesive layer 105 (as shown in FIG. 2). The adhesive layer 105 can comprise any adhesive material known in the art, including a liquid adhesive, a paste adhesive, or combinations thereof. In some embodiments, the adhesive comprises any adhesive that can be applied as a liquid and then converted to a solid by a curing process. One example of an adhesive material includes a resin like LC3200 3M™. The adhesive material can be deposited on the substrate 100 using any technique known in the art. Where the adhesive material comprises LC3200, it can be spin coated onto the substrate 100 using a method that liquid dispense from a nozzle onto the wafer while the wafer is spinning or before the wafer starts spinning. The liquid spins across the wafer to form a uniform film.

Next, a carrier 110 can be provided, as shown in FIG. 2. The carrier 110 may have any characteristic that allows it to support the wafer 100 and that can be used in the methods described herein. Any known carrier with these characteristics can be used in these methods. While the carrier can have any suitable form, in some embodiments the carrier has a form factor that is similar to the wafer 100. The carrier 110 can be fabricated of any known material, including glass, PYREX®, silicon, or other materials that are compatible with the singulation processes used. In some embodiments, the carrier comprises a glass carrier substrate.

Next, as shown in box 10 of FIG. 1, a release layer 115 can be provided on the carrier 110 (as shown in FIG. 2). The carrier 110 with the release layer 115 may be provided before, after, or at substantially the same time as the wafer 100 with adhesive layer 105. The release layer 115 can be any releasable material known in the art, including a proprietary Light-to-Heat Conversion (LTHC) layer manufacture by 3M™. The release layer 115 can be deposited on the substrate carrier 110 using any technique known in the art. Where the release layer 115 comprises LTHC, it can be spin coated onto the carrier 110 using a method that dispenses liquid from a nozzle onto the wafer while the wafer is spinning or before the wafer starts spinning. The liquid spins across the wafer to form a uniform film.

Next, as shown in box 20 of FIG. 1, the wafer 100 and the carrier 110 are connected so that the adhesive layer 105 and the release layer 115 are attached to each other by a temporary bond. Either the wafer or the carrier can be flipped and the placed on the other using any known wafer handling robotics or wafer-to-wafer bonding techniques. The adhesive layer 105 is then cured by any known technique, including by applying ultraviolet light (UV) or a thermal heat conduction. The resulting structure after the connection of the carrier to the wafer is illustrated in FIG. 2.

The methods continue at box 30 in FIG. 1 when a portion of the backside of the substrate 100 is removed. In such embodiments, a portion of the back surface can be removed by thinning the wafer using any process known in the art. For instance, a portion of the back surface of the wafer can be removed through grinding and/or etching. FIG. 3 depicts the resulting structure where a portion of the back surface 117 of the substrate 100 has been removed. Any desired amount of the back surface of the wafer can be removed until a desired thickness is achieved typically a thickness beyond the active doped transistor regions. In one example, the back surface of the wafer may ground so that the wafer is thinned to a thickness anywhere from about 0.1 micrometer (μm) to about 400 μm of the final wafer target thickness. In another example, the wafer can be ground to within about 1 μm and about 20 μm of the final wafer target thickness. In still another example, however, the wafer can be ground to within about 5 μm and about 10 μm of the final wafer target thickness.

Figure 4:
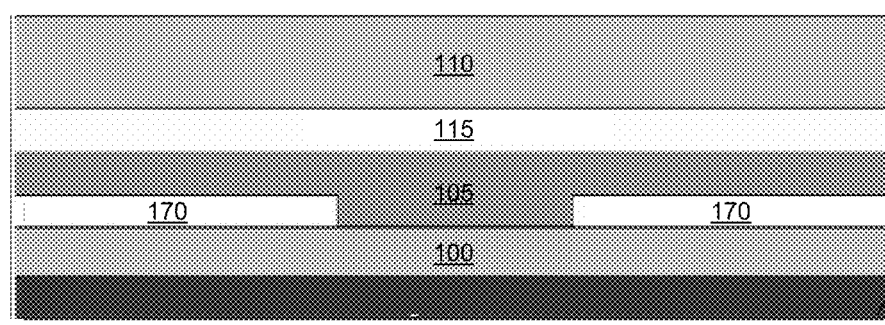
FIG. 4 shows some embodiments of methods for providing a backmetal layer.

The method continues at box 40 in FIG. 1 when a material is optionally deposited on the back surface of the wafer to make a backside layer. In some embodiments, any material suitable for deposition on the back surface of the wafer can be deposited on the wafer. Some non-limiting examples of suitable materials include a metal (e.g., silver, gold, lead, nickel, platinum, titanium, tin, and/or combinations thereof (e.g., NiPdAu, TiNiVAg, TiNiAg, TiCuAg, TiCu, NiCu, TiNiVAgAu, TiNiAgAu, or TiNiAgSn), an oxidation-resistant layer, a silicon layer, or an adhesion sub-layer. A metallized back surface of the die may serve several purposes, such as improving the electrical, thermal conduction and/or mechanical connection between the back surface of the die and another component of a semiconductor package or circuit. In some embodiments, the backside material comprises a TiNiAg backmetal layer 125 as shown in FIG. 4. In other embodiments, such as where the semiconductor device comprises an analog, memory or microprocessor device, a backside layer or a backmetal layer is not needed or used.

Next, as shown in box 50 of FIG. 1, a patterned photo-resist (PR) layer (or mask) 130 can be formed on the backside layer, including the backside metal layer 125. The PR mask 130 can be formed using any known process, including depositing the PR material and then patterning it using photolithography. The photolithography process uses front to back alignment so that the singulation etches occur primarily or only in the die edge. The resulting structure formed from the patterning process is illustrated in FIG. 5 where a portion of the PR layer 130 has been removed in the desired areas (where etching will occur in the underlying layers) to form a mask through which etching will later occur.

Figure 5:
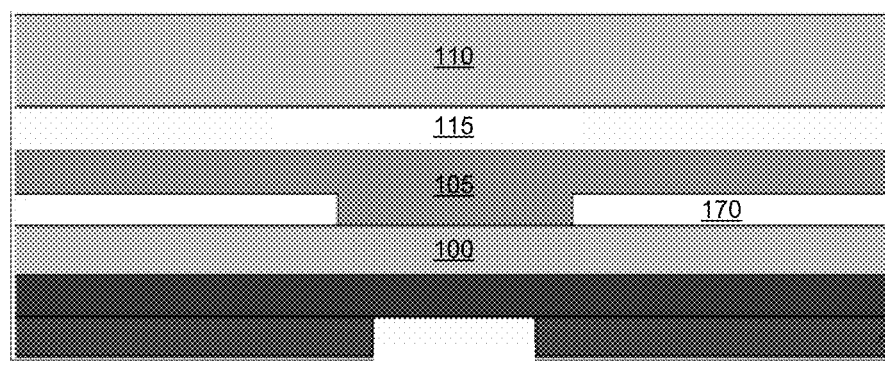
FIG. 5 shows some embodiments of methods for providing a patterned photo-resist layer.
Figure 6:
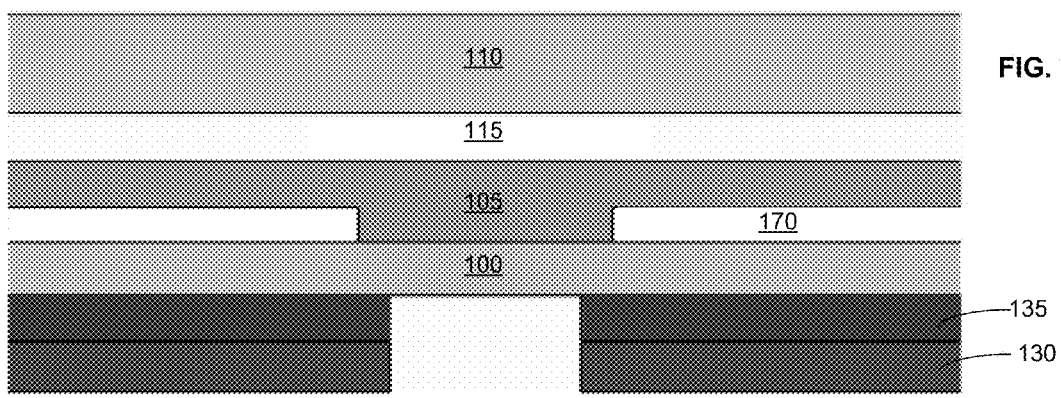
FIG. 6 shows some embodiments of methods for etching the backmetal layer using the patterned photo-resist.
Figure 7A:
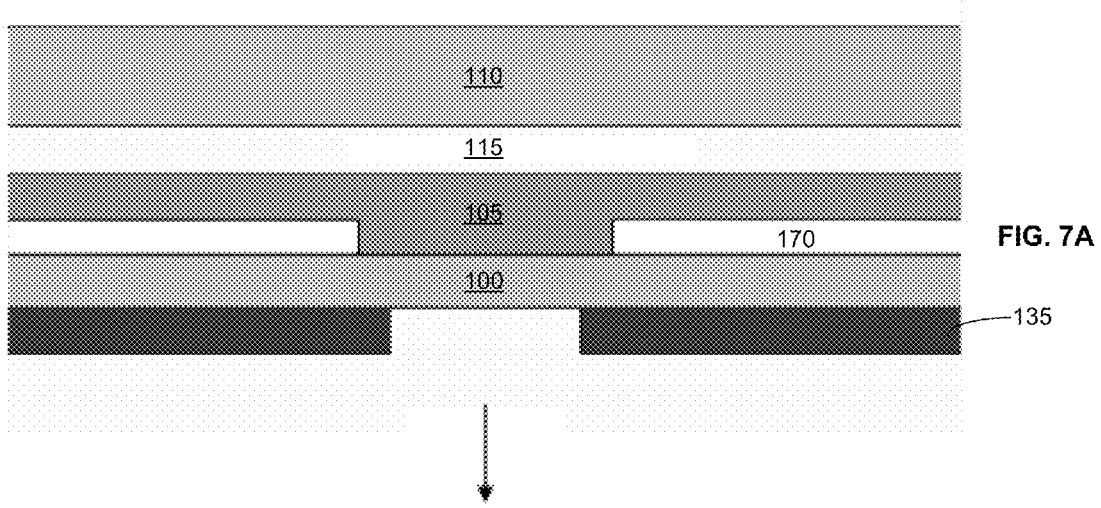
FIGS. 7A, 7B, and 7C shows some embodiments of methods for removing the patterned photo-resist layer.
Figure 7B:
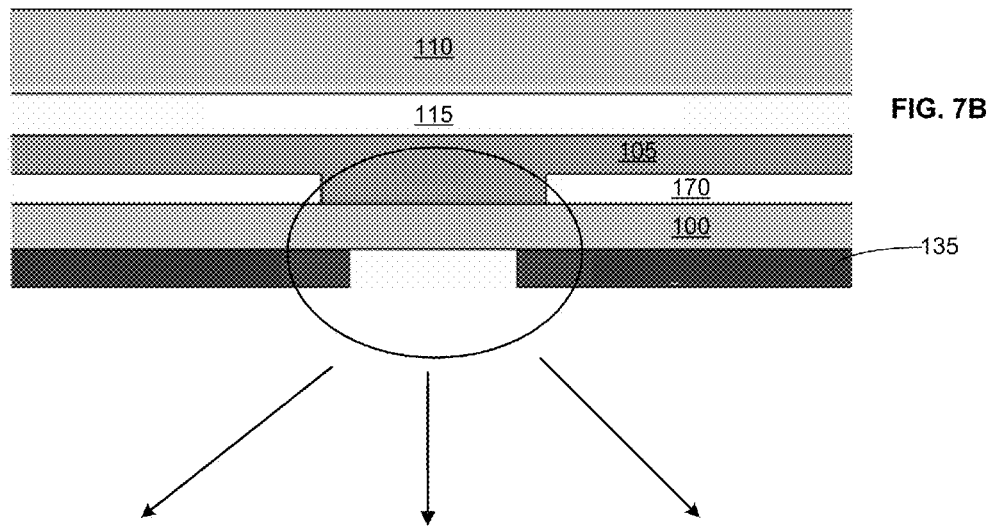
Figure 7C:
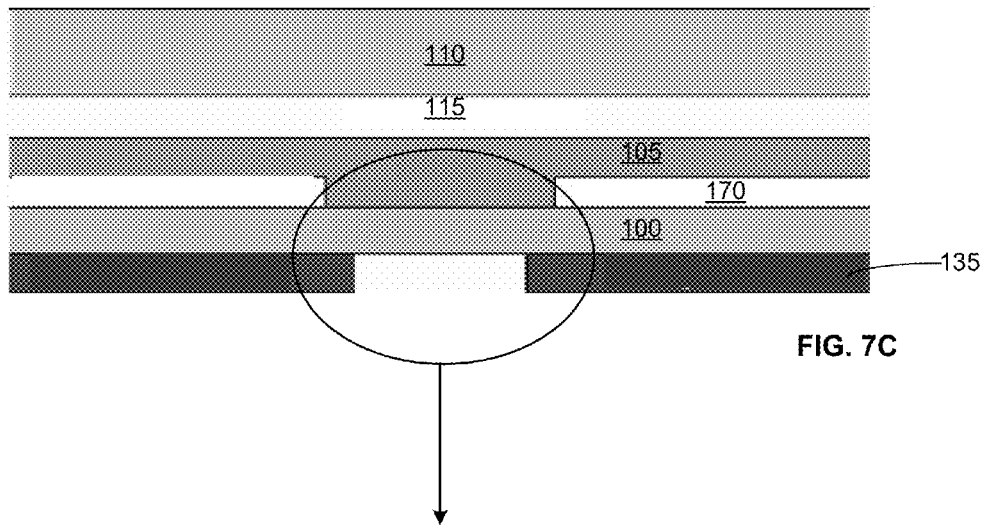

The PR mask 130 can then used to remove a part of the backmetal layer 125 by an isotropic etching process, as shown in FIGS. 5 and 6. The isotropic etching process can be performed using any etchant which selectively removes the exposed backmetal layer without removing any of the PR mask 130 or the material in the substrate 100. In some embodiments, the etching process can be performed using a MaTech tool or a Semitool SAT tool. In other embodiments where TiNiAg is used in the backmetal layer, the etching process can be performed using Kl acid (which attacks the Ag metal), a combination of nitric acid with sulfuric, sulfamic, and/or thyuria acids (which attacks the Ni), and a dilute HF acid (which attacks the Ti metal). After the etching process, the PR mask 130 can be removed using any known process, such as a stripping process using acetone or other known chemicals used to strip PR. After removal of the PR mask 130, the resulting structure is depicted in FIGS. 7a, 7b, and 7c where the device contains a patterned backmetal layer 135.

Figure 8:
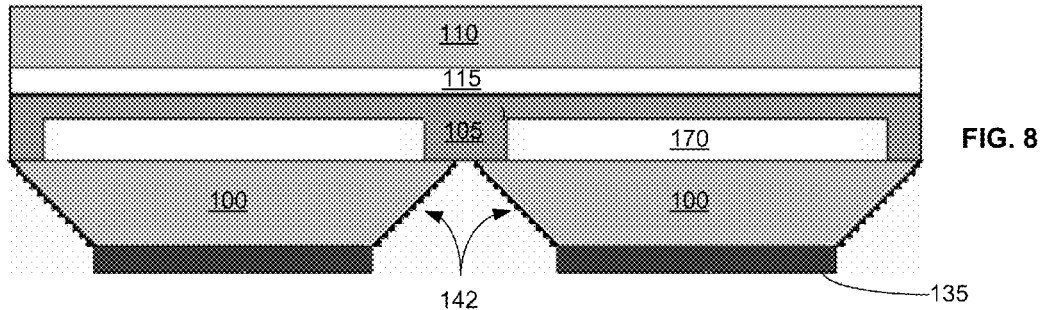
FIG. 8 shows some embodiments of methods for anisotropically etching the backside of the substrate to form a rough surface on the sidewall.
Figure 10:
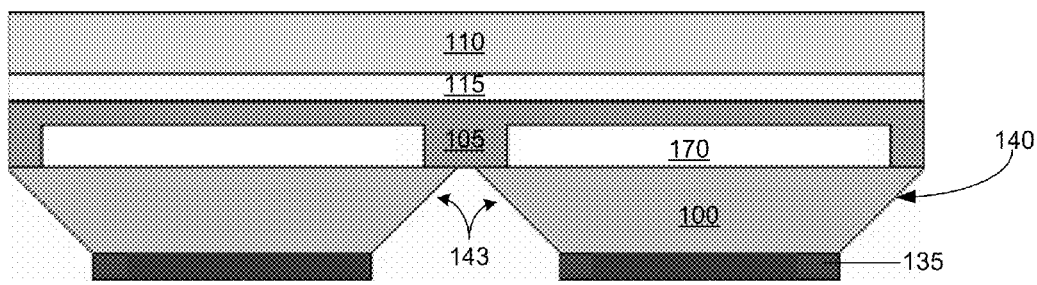
FIG. 10 shows some embodiments of methods for anisotropically etching the backside of the substrate to form a sidewall smooth surface.

The method continues, as shown in box 60 of FIG. 1, wherein the substrate 100 can be etched using the patterned backmetal layer 135. This etching process can be carried out using any anisotropic etching process which forms sidewalls (or edges) that are inclined relative to the angle of the sidewall of the patterned backmetal layer 135 (which, in some embodiments, is substantially vertical). The anisotropic etching process can be performed using any etchant which selectively removes the material of the substrate 100 without removing any of the patterned backmetal layer 135 or the material used in the adhesive layer 105, as shown in FIGS. 8 and 10. In the embodiments where the backmetal layer is not used, and a patterned backmetal is not created, then the PR mask is used to etch the substrate and is then removed.

In some embodiments, the anisotropic etching process using a Tetramethyl Ammonium Hydroxide (TMAH) etchant. The etching rate of the TMAH etchant can be varied to change the orientation of the angle or slope of the substrate sidewall 140 that is formed by this etching process. In some embodiments, the etching rate of the TMAH can range from about 0.6 to about 2 µm/min so that orientation of the sidewall can range from about 25 to less than 90 degrees. In other embodiments, the etching rate of the TMAH can range from about 0.5 to about 1.7 µm/min so that orientation of the sidewall can range from about 65 to less than about 80 degrees. In even other embodiments, the etching rate of the TMAH can range from about 0.1 to about 1.83 µm/min so that orientation of the sidewall can range from about 75 to less than about 80 degrees. As well, the orientation of the sidewall 140 can also depend on the crystallographic plane of the material in the substrate (i.e., Si). Thus, the specific wafer can be selected so that the TMAH etching process can be used to form the desired slope or angle of the sidewall 140.

The concentration of the TMAH in the etching solution as well as the temperature can also be controlled during the etching process. The temperature of the etching process can be controlled since it partly impacts the etching rate and so indirectly impacts the sidewall 140 orientation. The temperature can be controlled during the etching process to range from about 23 to about 90° C. In some embodiments, the temperature can be controlled during the etching process to range from about 60 to about 90° C.

The concentration of TMAH in the solution can be controlled since it impacts the texture of the sidewall. The concentration of the TMAH in the etching solution can range from about 1 to about 30 wt %. In other embodiments, the concentration of the TMAH in the etching solution can range from about 5 to about 25 wt %.

The temperature of the etching process also partially impacts the texture of the sidewall. The texture of the sidewall 140 can range from a rough surface 142, as shown in FIG. 8, to a smooth surface 143, as shown in FIG. 10. In some embodiments, the texture can be considered smooth since the Ra value can range from more than 0 Å to less than 1000 Å. In some embodiments, the texture can be considered rough since the Ra value can range from 3000 Å to about 18,000 Å. In other embodiments, the Ra value of the rough surface can range from 10,000 Å to about 14,000 Å. At the front die surface, a lower Ra value is better for singulation purposes.

In some configurations, the texture of the sloped sidewalls 140 can be modified by the addition of texturing agents that have been added to the TMAH etching solution. These texturing agents include surfactants such as NCW-601A (sold by Waco Chemicals) and isopropyl alcohol (IPA). Examples of the texturing agents include doping the TMAH-water solutions with Si, IPA, pyrocatechol and NCW-601A, and combinations thereof. The texturing agents need only be added in an amount sufficient to modify the texture in the needed amount. In some instances, the texturing agents can be added in an amount ranging from about 0.01 to about 1 wt % of the TMAH etching solution.

Figure 9:
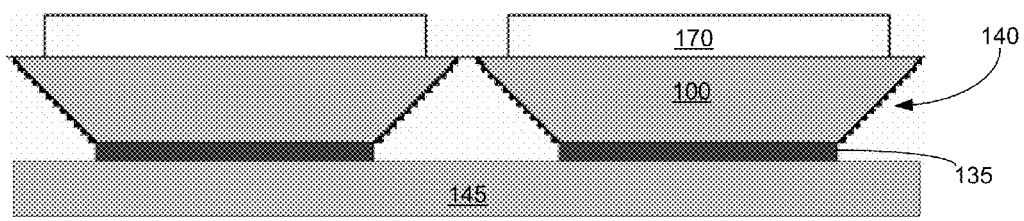
FIG. 9 shows some embodiments of methods for attaching a dicing tape to the pattern backmetal layer.
Figure 11:
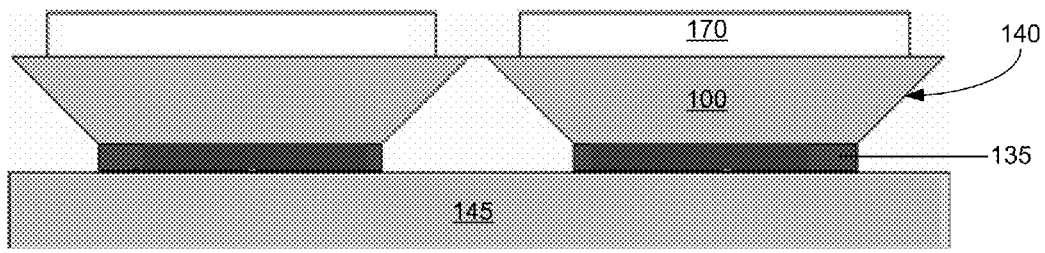
FIG. 11 shows some embodiments of methods for attaching a dicing tape to the pattern backmetal layer.

With the sloped sidewalls formed, the method continues (as shown in box 70 of FIG. 1) by attaching the wafer 100 to the die attach tape that on top of a dicing frame 150 as shown in FIG. 24. Then, as shown in box 80 of FIG. 1, the carrier 110 is removed from the wafer 100. In some instances, as shown in FIG. 24, this removal process can include the process that the release layer be removed by using a laser 155. Then, as shown in box 90 of FIG. 1, the adhesive layer 105 can be removed to leave the wafer 100 on the dicing frame 150. As shown in FIG. 24, this removal process can be performed by peeling the cured adhesive layer and then optionally rinsing the surface of the wafer 100. The resulting structure with the patterned backmetal layer 135 attached to a lead frame die attach tape 145 is shown in FIGS. 9 and 11 with the upper surfaces of adjacent dies 170 attached to each other when laid out on the die attach tape.

In some embodiments, the methods can be modified so that the sloped sidewalls 140 contain both a rough surface 142 and a smooth surface 143. In some configuration, the rough portion can be contained near the front side and the smooth portion can be located near the back side. In other embodiments, though, the rough portion can be located near the back side of the substrate 100 (as shown in FIG. 12) because this helps to reduce to prevent die attach solder from wicking up on the backside of the die. In still other embodiments, the smooth portion is located near the front side of the wafer (as shown in FIG. 12) since this allows a clean breaking edge that can be used when separating the wafer 100 from the adhesive layer 105. In some configurations, the rough and the smooth portions are both about 50% of the sidewall area. In other embodiments, the area of the rough portion can range from about 10 to about 90% of the sidewall and the areas of the smooth portion can range from about 90 to about 10% of the sidewall.

The location and the amount of the rough portion and the smooth portion on the sidewall 140 can be adjusted by modifying the parameters of the etching process. With the embodiments shown in FIG. 12, the rough surface 142 can be formed near the backside and the smooth portion near the front side of the substrate 100 by a two step etching process. The first step uses a first etching solution (i.e., 5 wt % TMAH) at a first temperature (i.e., 90° C.) until the lower part of the sidewall is formed with the desired rough texture. The second step can then merely add surfactants (i.e., NCW-601A and/or IPA) to the etching mixture and continue until the upper part of the sidewall is formed with the desired smooth texture. The process can then continue as described above to form the structure depicted in FIG. 13 that is attached to the die attach tape 145.

In some embodiments, the angle or slope of the sidewall can be changed so that the slope changes along the length of the sidewall. In these embodiments, the texture of the surface can be the same, or can be both rough and smooth, as shown in FIG. 14. With the embodiments shown in FIG. 14, the rough surface 142 with a first slope of about 80 degrees can be formed near the backside and the smooth portion near the front side of the substrate 100 with a second slope of about 65 degrees by a two step etching process. The first step uses a first etching solution (i.e., about 5 wt % TMAH) at a first temperature (i.e., about 90° C.) until the lower part of the sidewall is formed with the desired rough texture and the first slope. In the second step, the concentration of the TMAH can be changed to about 20 wt %, the temperature can be changed to 70° C., and surfactants (i.e., IPA and/or NCW-601A) are added to the etching mixture and the etching process continues until the upper part of the sidewall is formed with the desired smooth texture and the second slope. The process can then continue as described above to form the structure depicted in FIG. 15 that is attached to the die attach tape 145.

Figure 16:
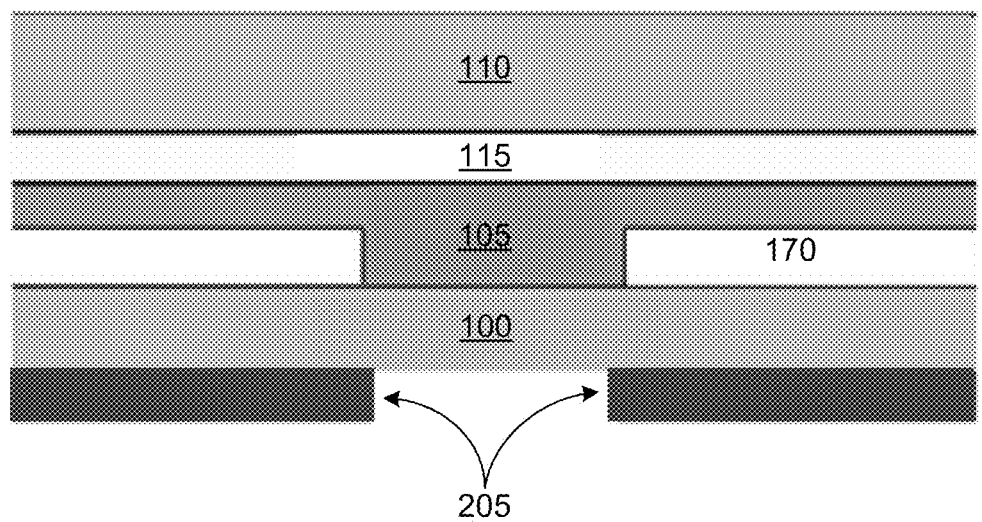
FIG. 16 shows some embodiments of methods for providing a first patterned photoresist layer (or mask)

In some configurations, the dies can contain a curved (including concave) shape on the sidewall rather than a straight line as described above. In some embodiments, the whole sidewall can have a substantially concave shape. In other embodiments, though, only a lower part of sidewall near the backside contains a substantially concave shape. The devices with these configurations can be formed by following the process outlined in FIG. 1 until the wafer 100 and the carrier 110 have been attached to each other. After those processes, a first patterned PR mask 205 is provided on the backside of the substrate 100, as shown in box 5 of FIG. 1. The first PR mask 205 can be formed using any known process, including depositing the PR material and then patterning it using photolithography and the front to back alignment described above. The structure formed after the patterning process is illustrated in FIG. 16 where a portion of the PR layer has been removed in the desired areas (where etching will later occur in the underlying layers using the PR mask 205).

Figure 17:
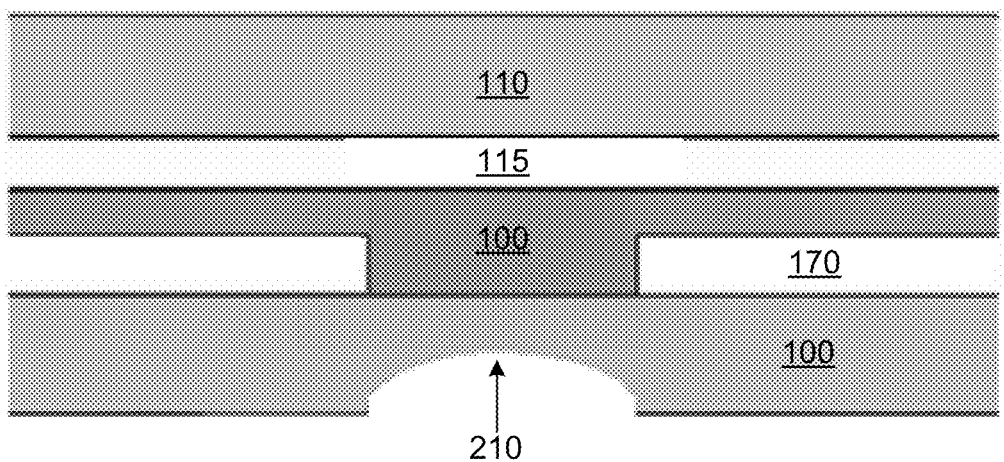
FIG. 17 shows some embodiments of methods for isotropically etching the backside of the substrate using the first photoresist mask.

The first PR mask 205 can then be used to remove a part of the substrate 100 by an isotropic etching process, as shown in box 15 of FIG. 1. The isotropic etching process can be performed using any etchant which selectively removes the substrate 100 without removing any of the first PR mask 205, as shown in FIG. 16. In some embodiments, the etching process can be performed using a MaTech tool. In other embodiments where Si is the substrate, the etching process can be performed using an etching solution containing a combination of HF, nitric, and acetic acids (collectively, a HNA etching solution). The concentration of the HNA in this etching solution can range from about 25 to less than 100 wt %. After the etching process, the first PR mask 205 is removed using any known process, such as a stripping process using acetone or a dry etch (ashing) process. After removal of the first PR mask 205, the resulting structure is depicted in FIG. 17 where the substrate 100 contains a convex portion 210 that has been removed.

Figure 18:
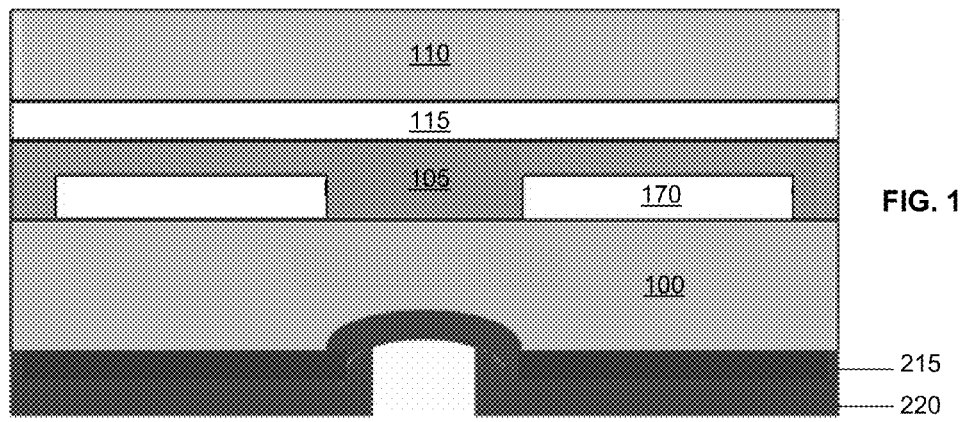
FIG. 18 shows some embodiments of methods for providing a backmetal layer and a second patterned photoresist layer (or mask)

The method continues at box 25 in FIG. 1 when a material is optionally deposited on the back surface of the wafer to create a backside layer. In such embodiments, any material suitable for deposition on the back surface of the wafer can be deposited on the wafer. Some non-limiting examples of suitable materials include a metal (e.g., silver, gold, lead, nickel, platinum, titanium, tin, and/or combinations thereof (e.g., NiPdAu, TiNiAgAu, or TiNiAgSn)), an oxidation-resistant layer, or an adhesion sub-layer. In some embodiments, the backside material comprises a TiNiAg backmetal layer 215 as shown in FIG. 18. The backmetal layer 215 fills in the convex portion 210 of the substrate. In other embodiments, and as described above, the backside layer is not used.

Next, a second patterned PR mask 220 is provided on the backside of the backmetal layer 215, as shown in box 35 of FIG. 1. The second PR mask 220 can be formed using any known process, including depositing the second PR material and then patterning it using photolithography using the front to back alignment process described above. The structure resulting from the patterning process is illustrated in FIG. 18 where a portion of the second PR mask 220 extends into the convex shape of the backmetal layer 215.

Figure 19:
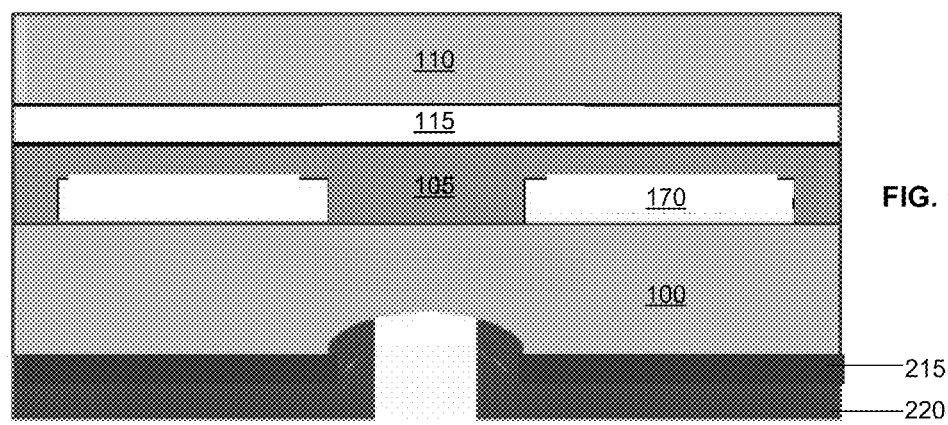
FIG. 19 shows some embodiments of methods for etching the backmetal layer using the second photoresist mask.

As shown in box 45 of FIG. 1, the second PR mask 220 can then be used to remove a part of the backmetal layer 215 by any isotropic etching process, including the isotropic process described above in reference to box 50 of FIG. 1. This isotropic etching process removes a part of backmetal layer 215 that fills in the convex shape of the substrate. Thus, an upper portion of the convex substrate shape 210 is exposed as shown in FIG. 19.

Figure 20:
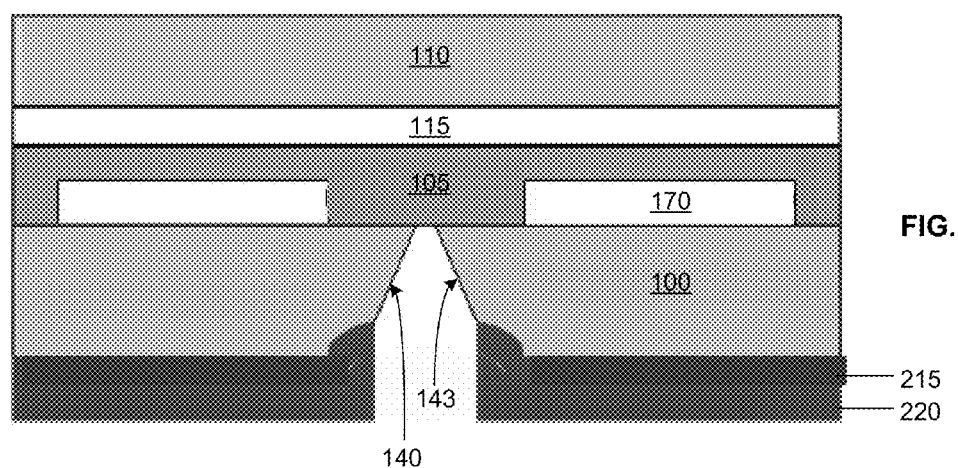
FIG. 20 shows some embodiments of methods for anisotropically etching the backside of the substrate using the patterned backmetal layer to form a sidewall with a smooth surface.
Figure 21:
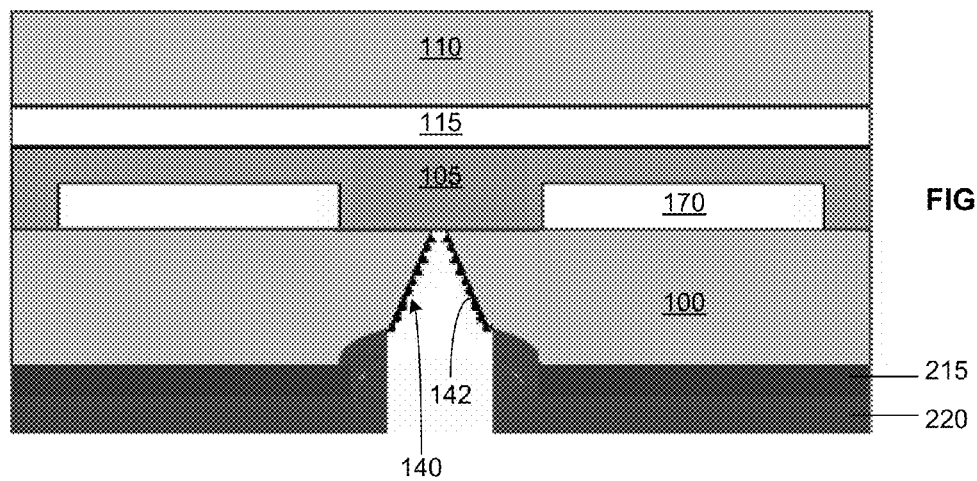
FIG. 21 shows some embodiments of methods for anisotropically etching the backside of the substrate using the patterned backmetal layer to form a sidewall with a rough surface.

As shown in box 55 of FIG. 1, the second PR mask 220 is removed using any known process, such as a stripping process using acetone since it does not attack the adhesive layer. With the second PR mask 220 removed, an additional amount of the substrate 100 is removed by an anisotropic etching process as shown in box 65 of FIG. 1. In some embodiments, the anisotropic etching process can be substantially similar to that process described above that uses TMAH as the etchant. The resulting structure is illustrated in FIGS. 20 and 21. As described above, the parameters of the TMAH process can be controlled to form a smooth surface (as shown in FIG. 20) or a rough surface (as shown in FIG. 21).

Figure 22:
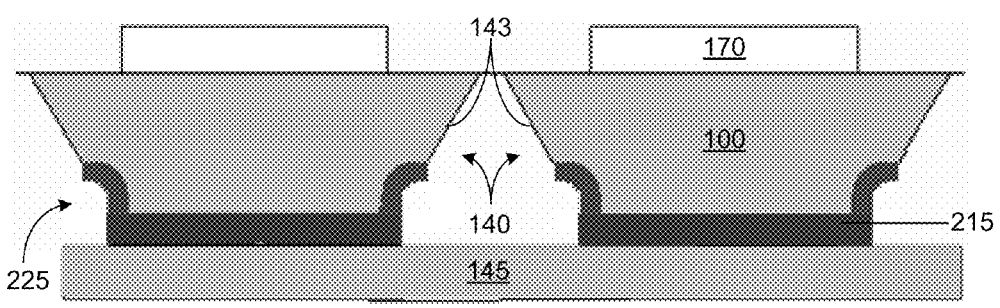
FIGS. 22 and 23 show some embodiments of methods for attaching a die attach tape to the patterned backmetal layer.
Figure 23:
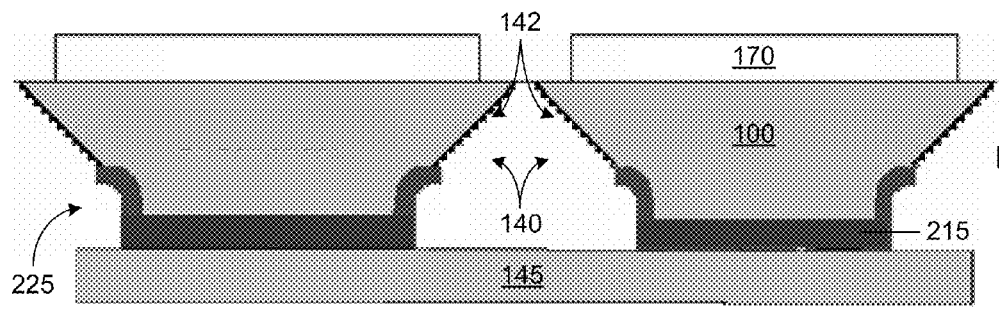

As shown in FIG. 1, the method then continues with the remainder of the processes described above. The wafer 100 is attached to a die attach tape 145 of dicing frame 150, the carrier 110 is removed, and the adhesive layer 105 is then removed as shown in FIG. 24. The structure of the device containing a smooth sidewall is shown in FIG. 22 and the structure of the device containing a rough sidewall is shown in FIG. 23. As shown in both FIGS. 22 and 23, the bottom part of the substrate contains a concave portion 210 and the ends of the backmetal layer also contain a concave portion 225.

The end result of these methods is the formation of individual dies 160 containing backmetal layers that are located on the die attach tape 145. The individual dies can be removed from the die attach tape 145 using any known method. In the embodiments where the upper surface of a die 160 is attached to an adjacent die, the dies can first be cleaved or broken from each other in standard pick and place (PnP) tools used to eject the die from the dicing tape and place onto a solder or epoxy on a leadframe.

Figure 25:
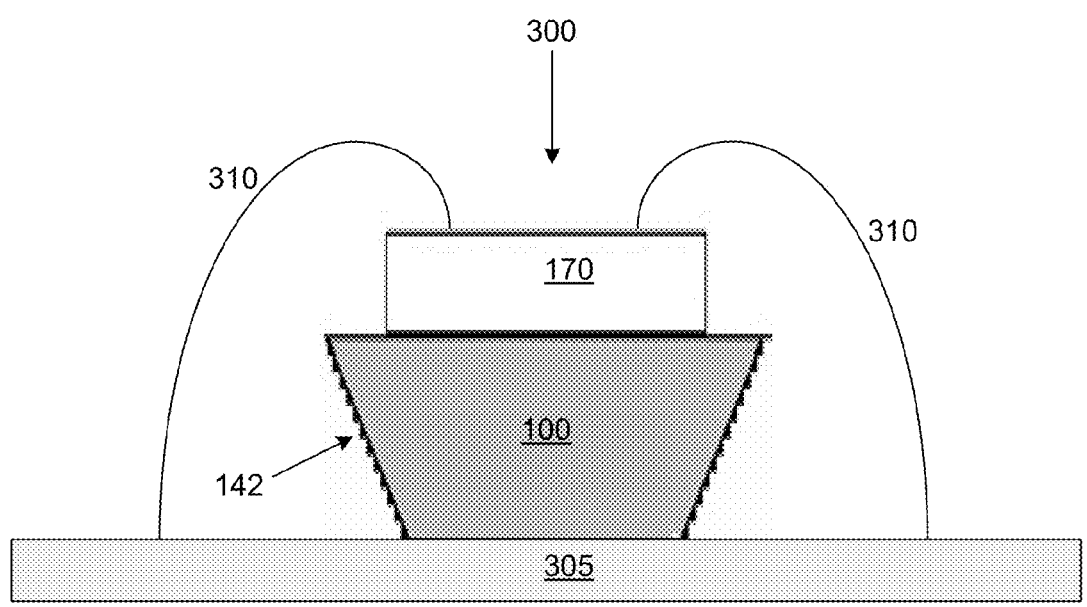
FIG. 25 show some embodiments of methods for attaching the die without a backside layer to a leadframe.

The dies formed above can be packaged as known in the art and using into a variety of electronic devices, such as power MOSFETs, analog devices, memory devices, and/or microprocessors. As part of the packaging process, the die(s) can be connected to a leadframe using any known connection in the art, including flip-chip technologies, wire-bonding technologies, and the like. For example, in some embodiments, a die 300 with rough textured sidewalls 142 that does not contain a backside or backmetal layer is attached to a leadframe 305, as shown in FIG. 25. The integrated circuit device (i.e., MOSFET 170) is electronically connected to the leadframe 305 using wire bonds 310. The back surface of the die 300 can be attached to the leadframe 305 using any known die-attach processes.

The dies formed from these methods contain several interesting features. First, the dies contain more surface area on the Si top surface (containing the transistor) than on the Si bottom surface (containing the drain/heat sink, not including the attached leadframe). This increased surface area allows less Si and more die attach materials to vertically and horizontally thermally conduct heat away from the semiconductor device. In some embodiments, the surface area of the upper surface can be about 1 to about 75% greater than the surface area of the bottom surface. In other embodiments, the surface area of the upper surface can be about 5% to about 50% greater than the surface area of the bottom surface.

Another feature is that the die contains a lateral edge or sidewall that is not perpendicular to the surface of the upper surface and/or the bottom surface of the die. Instead, as described in detail above, the sidewall is inclined relative to a vertical plane that is substantially perpendicular to the surface of the upper surface and/or the bottom surface of the die). This sloped sidewall allows the etch technique to not experience loading effects and slow down as the backside etch removes silicon from the wafer.

Another feature is that the die can contain a rough or a smooth texture along any desired portion of the sidewall. The rough or smooth texture can be selected for the desired portion of the sidewall to meet packaging or performance characteristics desired.

These methods provide several benefits to the formation of the semiconductor dies. First, they reduce the cost for forming dies by about 10% since the die streets that are formed in the wafer can be reduced from about 60 μm to about 5 μm or less, enabling more dies to be manufacture per wafer. Other singulation methods that use a saw (such as a diamond saw) have a 1 to 0.1% DPW loss due to the die edge chip-outs that come from micro-fractures created by the saw. The wet etch methods described above improves the Si electrical characteristics because it leaves no Si microfractures unlike the Si microfractures caused by the mechanical nature of Si removal by an abrasive diamond blade. This situation happens because a wet etch is a soft removal procedure. Similarly, there is no heat damage from the wet etching process as is often found in laser or mechanical blade singulation methods. In laser or mechanical blade singulation methods, the localized heat of these methods cause a localized thermal material expansion in the die streets. This localized thermal expansion causes Si to Si microfractures and Si to Si stress, which changes the Silicon electrical characteristics.

Third, the new wet etch techniques improve the control of the bond line thickness (BLT). The roughened texture of the sidewall near the backside reduces wicking (the spread of epoxy or solder along the lateral edge of the die) which often results in the loss of BLT control and consequently cracking of the edges of the Si die. The methods create a die structure containing dam to hold back epoxy or solder spreading along die edge.

Fourth, the die structures created by some of these methods contain an increased backside contact area near the corner portion, providing a closer contact on the backside and improving the on-resistance ($RDS_{on}$).

Finally, unlike other singulation methods which the separation action initiates from the front side of the wafer, the methods described herein occur from the back side of the wafer. Such an action permits the smaller surface area of the die backside when compared to the die front side.

In some embodiments, a semiconductor die can be formed by the methods comprising: providing an adhesive layer on an upper surface of a substrate wafer; connecting the adhesive layer to a carrier; providing a patterned layer on the bottom surface of the wafer; anisotropically etching the substrate using the patterned layer and a TMAH etching solution until the adhesive layer is exposed; attaching the die to a die attach tape; and removing the carrier and the adhesive layer.

In other embodiments, a semiconductor die can be formed by the methods comprising:—providing an adhesive layer on an upper surface of a wafer; connecting the adhesive layer to a carrier; providing a first patterned photoresist layer on the bottom surface of the wafer and isotropically etching a first portion of the bottom surface using the first patterned photoresist layer; removing the first patterned photoresist layer; providing a second patterned layer on the substrate and anisotropically etching the substrate using the second patterned layer and a TMAH etching solution until the adhesive layer is exposed; attaching the die to a die attach tape; and removing the carrier and the adhesive layer.

Having described the preferred aspects of the methods for singulating semiconductor devices, it is understood that the appended claims are not to be limited by particular details set forth in the description presented above, as many apparent variations thereof are possible without departing from the spirit or scope thereof.

The invention claimed is:

1. A semiconductor die containing an integrated circuit, comprising:
    an upper semiconductor material surface;
    a semiconductor bottom surface having an area smaller than the upper surface by about 1 to 75%;
    a sidewall between the upper and bottom surfaces that is not perpendicular to the upper or bottom surface; and
    a backside layer on the bottom surface.

2. The die of claim 1, wherein the area of the smaller surface is smaller than the area of the upper surface by about 5 to about 50%.

3. The die of claim 1, wherein the angle of the sidewall is greater than 0 but less than about 65 degrees relative to a vertical plane that is substantially perpendicular to the upper or bottom surface.

4. The die of claim 3, wherein the sidewall angle ranges from about 10 to about 25 degrees.

5. The die of claim 4, wherein the sidewall angle ranges from about 10 to about 15 degrees.

6. The die of claim 1, wherein the sidewall comprises a concave shape near the bottom surface of the die and a straight shape near the upper surface.

7. The die of claim 1, wherein the sidewall contains both a rough portion and a smooth portion.

8. The die of claim 7, wherein the rough portion of the sidewall extends from about 5 to about 250 μm from the bottom surface.

9. The die of claim 8, wherein the rough portion comprises from about 10 to about 90% of the sidewall and the smooth portion comprises about 90 to about 10%.

10. The die of claim 1, wherein the die is connected to a leadframe.

11. A semiconductor die containing an integrated circuit, comprising:
- an upper surface;
- a bottom surface having an area smaller than the upper surface by about 1 to about 75%; and
- a backside layer formed on the bottom surface;
- a sidewall between the upper and bottom surfaces that is not perpendicular to the upper or bottom surface and that contains both a rough portion near the bottom surface and a smooth portion near the upper surface.

12. The die of claim 3, wherein the angle of the sidewall angle ranges from about 10 to about 25 degrees relative to a vertical plane that is substantially perpendicular to the upper or bottom surface.

13. The die of claim 12, wherein the sidewall angle ranges from about 10 to about 15 degrees.

14. The die of claim 11, wherein the sidewall comprises a concave shape near the bottom surface of the die and a straight shape near the upper surface.

15. The die of claim 14, wherein the curved slope of the concave shape extends from about 10 to about 200 μm from the bottom surface.

16. The die of claim 11, wherein the rough portion of the sidewall extends from about 5 to about 250 μm from the bottom surface.

17. The die of claim 16, wherein the rough portion comprises from about 10 to about 90% of the sidewall and the smooth portion comprises about 90 to about 10%.

18. An electronic device containing a semiconductor die with an integrated circuit, the die comprising:
- an upper surface;
- a bottom surface having an area smaller than the upper surface by about 1 to about 75%; and
- a backside layer formed on the bottom surface;
- a sidewall between the upper and bottom surfaces that is not perpendicular to the upper or bottom surface and that contains both a rough portion near the bottom surface and a smooth portion near the upper surface.

19. The device of claim 18, wherein the angle of the sidewall angle ranges from about 10 to about 25 degrees relative to a vertical plane that is substantially perpendicular to the upper or bottom surface.

20. The device of claim 18, wherein the sidewall comprises a concave shape near the bottom surface of the die and a straight shape near the upper surface.

21. The device of claim 18, wherein the rough portion of the sidewall extends from about 5 to about 250 μm from the bottom surface.

22. The device of claim 21, wherein the rough portion comprises from about 10 to about 90% of the sidewall and the smooth portion comprises about 90 to about 10%.

23. The device of claim 18, further comprising a leadframe that is connected to the die.

* * * * *